United States Patent [19]
Nakayama

[11] Patent Number: 5,105,251
[45] Date of Patent: Apr. 14, 1992

[54] SEMICONDUCTOR DEVICE

[75] Inventor: Tsuneo Nakayama, Yokohama, Japan

[73] Assignee: Kabushiki Kaisha Toshiba, Kawasaki, Japan

[21] Appl. No.: 723,419

[22] Filed: Jun. 28, 1991

[30] Foreign Application Priority Data

Jul. 3, 1990 [JP] Japan ................... 2-175950

[51] Int. Cl.$^5$ ............ H01L 27/02; H01L 29/10; H01L 31/12
[52] U.S. Cl. ............ 357/41; 357/23.4; 357/19
[58] Field of Search ............ 357/41, 23.4, 19, 90

[56] References Cited

U.S. PATENT DOCUMENTS 5,031,009  7/1991  Fujihara .................. 357/23.4
5,032,880  7/1991  Tsunoda .................. 357/23.4

Primary Examiner—Mark Prenty
Attorney, Agent, or Firm—Oblon, Spivak, McClelland, Maier & Neustadt

[57] ABSTRACT

A semiconductor of the present invention comprises first and second power MOS transistors of the same channel type, which are formed on the same semiconductor chip in a common drain, and means for supplying a control signal to each gate of these transistors. According to the above-mentioned structure, formation of one chip can be obtained by use of a common drain, thereby obtaining a switch member having high integration and high reliance.

7 Claims, 5 Drawing Sheets

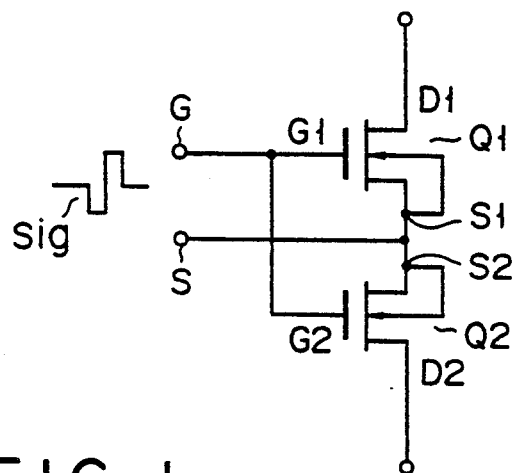
F I G. 1
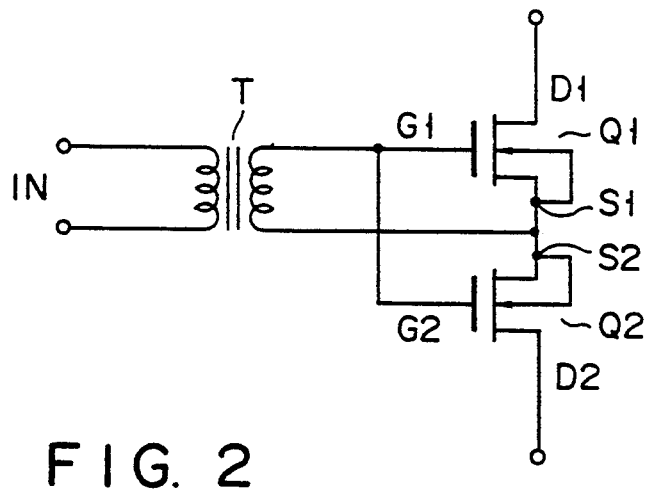
F I G. 2
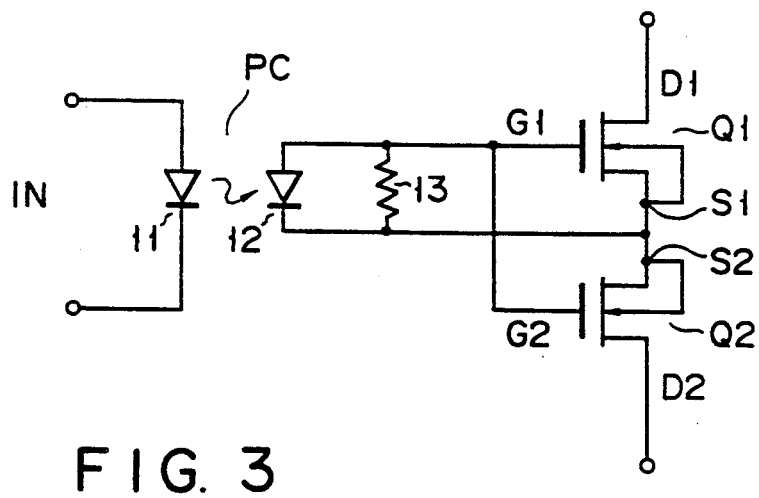
F I G. 3

SEMICONDUCTOR DEVICE

BACKGROUND OF THE INVENTION

1. Field of the Invention

The present invention relates to the semiconductor device using first and second power MOSFETs (MOS transistors), and more particularly to the semiconductor device which is incorporated with a transformer, a photo-coupler and the like and includes an analog switch, and uses as a solid state relay.

2. Description of the Related Art

Conventionally, two power MOS transistors are connected in series to a solid state relay, a slic for telephone and like. Regarding this connection, as shown in FIG. 1, sources S1 and S2 of power MOS transistors Q1 and Q2 are connected in common with each other.

As shown in FIG. 1, a control signal is sent between a common gate G and an electrode of a common source S, so that both transistors Q1 and Q2 are in an ON state or OFF state If the control signal (Sig) is send therebetween and the common gate G is positive and the common source S is negative, both transistors Q1 and Q2 are in an ON state, and a current in positive and negative directions can be supplied between drains D1 and D2 due to the property of the power MOS transistor. In the OFF state, either positive or negative voltage is applied between the drain D1 of the transistor Q1 and the drain D2 of the transistor Q2. However, due to breakdown voltage (reverse bias) between the drain and the source of either the transistors Q1 or Q2, the current is prevented from flowing through the drains D1 and D2.

FIGS. 2 and 3 show a circuit wherein a transformer T and a photo-coupler PC are incorporated into the circuit of FIG. 1. In these drawings, reference numeral 11 denotes a light-emitting element, reference numeral 12 denotes a photoelectric transfer element, and reference numeral 13 denotes a resistor.

In FIG. 2, transistors Q1 and Q2 have a single MOS power transistor chip, respectively. In FIG. 3, there are used four semiconductor chips for transistors Q1, Q2, photoelectric transformer element 12, and light-emitting element 11.

Moreover, in a transformer-type structure of FIG. 2, an input signal IN is used in only a case when an ac input is supplied by the transformer. In a case of FIG. 3, an input signal IN can be used in a case when a dc input is supplied.

Generally, the power MOS transistor has the structure as shown in FIG. 4. In the drawing, reference numeral 21 denotes an insulating film, 22: an N+ layer, 23: a P layer, 24: an N− layer, 25: an N+ layer, 26: a substrate of a drain electrode, and D: a whole drain. In the structure shown in FIGS. 1 to 4, there are used two semiconductor chips as common sources (S1, S2) in a transistor section of FIG. 5.

Due to this, since the connection between the chips of the power MOS transistors Q1 and Q2 is made by a wire bonding, there are problems in reliance on such a connection, increase in the number of assembly. Moreover, since the structure of the frame for die bonding becomes complicated, cost of manufacture is increased.

SUMMARY OF THE INVENTION

An object of the present invention is that at least first and second power MOS transistors can be structured on the same semiconductor chip in order to solve the above problems.

The semiconductor device of the present invention comprises first and second power MOS transistors of the same channel type formed on the same semiconductor chip in a common drain, and means for supplying a control signal to each gate of these transistors.

In other words, the present invention aims at the point that the first and second power MOS transistors are formed on one semiconductor chip and used as a switch element in a common drain in order to simplify the assembly of the device, improve reliance of the device, and reduce the cost of manufacturing the device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view showing a conventional electrical equivalent circuit used in a switch type semiconductor device using first and second power MOSFETs (MOS transistor);

FIGS. 2 and 3 are views showing a conventional switching control circuit using the device of FIG. 1;

DETAILED DESCRIPTION OF THE PREFERRED EMBODIMENTS

The embodiments of the present invention will be explained with reference to the drawings.

Figure 7:
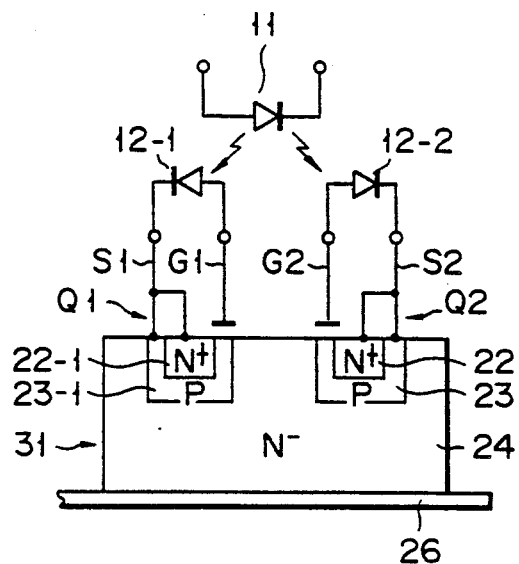
FIG. 7 is a cross sectional view showing one embodiment of the present invention.
Figure 8:
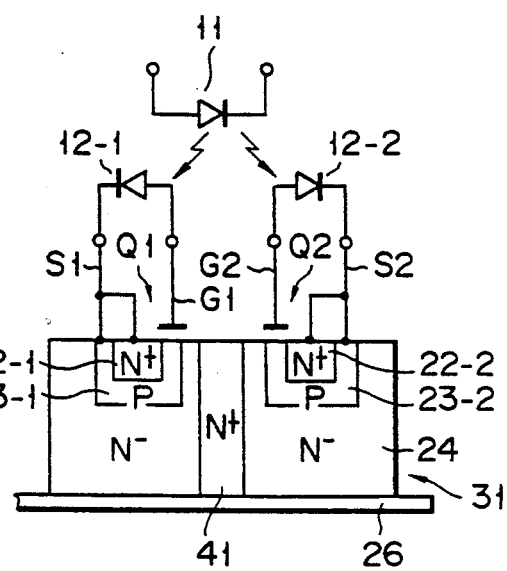
FIGS. 8 and 9 are cross sectional views showing different embodiments of the present invention.

FIG. 7 is a cross sectional view showing one embodiment of the present invention. In this drawing, the same reference numerals as those of the prior art are used in the portions corresponding to the prior arts. In this embodiment, as shown in FIG. 7, there are formed N−channel type power MOS transistors Q1 and Q2 on a chip 31 where the side of N− layer 24 is used as a common drain. Gate electrodes G1 and G2 of the transistors Q1 and Q2 and source electrodes S1 and S2 are individually taken up. Then, a photoelectric transfer element 12-1 is formed between the electrodes G1 and S1, and a photoelectric transfer element 12-2 is formed between the electrodes G2 and S2. Then, by use of the light-emitting element 11, control inputs of gates G1 and G2 are individually sent to the electrodes through the photoelectric transfer elements 12-1 and 12-2. The transistor Q1 is formed of an N+ type source layer 22-1, a P type layer 23-1 where a channel is formed, a N− type common drain layer 24 and a gate G1. The transistor Q2 is formed of an N+ type source layer 22-2, a P type layer 23-2 where a channel is formed, a common drain layer 24 and a gate G2. The chip 31, where the transistors Q1 and Q2 are formed, is formed on a substrate 26 of the drain electrode. Here, the transistors Q1 and Q2 are used as a switching element. FIG. 8 shows an example wherein an N+ layer 41 for preventing a depletion layer from being extended is formed between transistors Q1 and Q2. The N+ layer 41 is formed to prevent the breakdown voltage of $V_{CEO}$ mode (voltage between the collector and emitter in a state that a base opens) from being deteriorated if a current amplification factor $H_{FE}$ of a parasitic bipolar structure shown in FIG. 7 is high.

Figure 9:
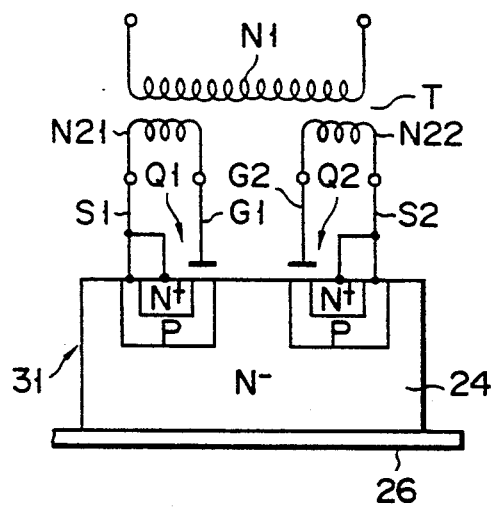

FIG. 9 shows an example wherein a transformer T is used as control means for controlling transistors Q1 and Q2. The transformer T sends the control signal to the gate of each transistor through a primary coil N1 and secondary coils N21 and N22.

Figure 10:
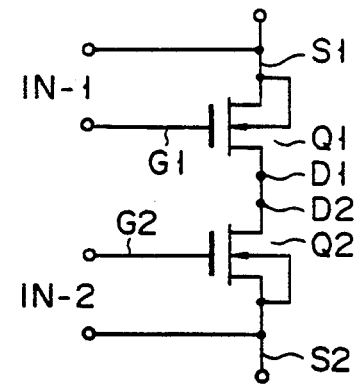
FIG. 10 is a view showing an electrical equivalent circuit of the transistor of FIGS. 7 to 9.

FIG. 10 is a view showing an electrical equivalent circuit of each of the transistors Q1 and Q2. More specifically, the transistors Q1 and Q2, which are formed on one chip, are used as a switch element, and the control of the transistors is performed by individually inputting control signals IN-1 and IN2 by use of the photoelectric transfer element such as a photo cell shown in FIGS. 7 and 8 and the transformer shown in FIG. 9.

Figure 4:
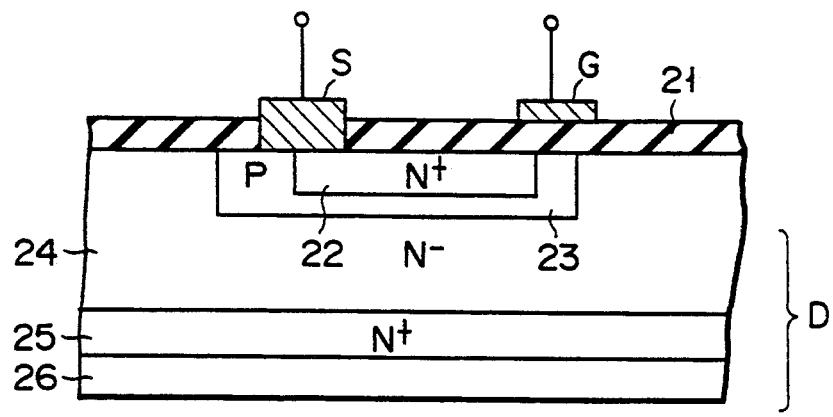
FIG. 4 is a cross sectional view showing an ordinary power MOS transistor.
Figure 5:
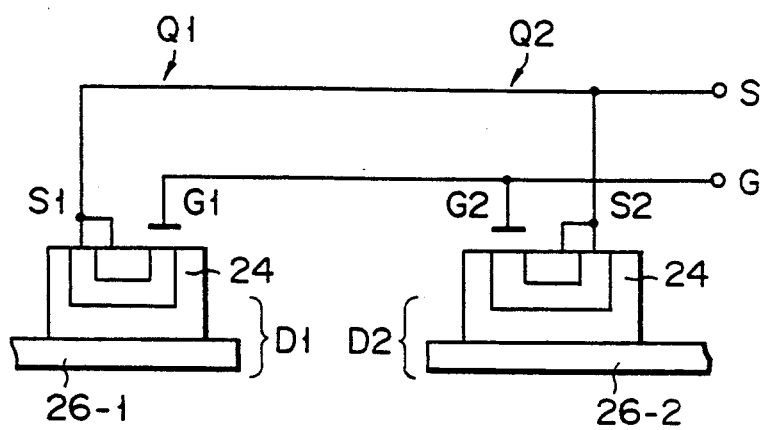
FIG. 5 is a cross sectional view showing that the device of FIG. 1 is formed by use of two same structures.
Figure 6:
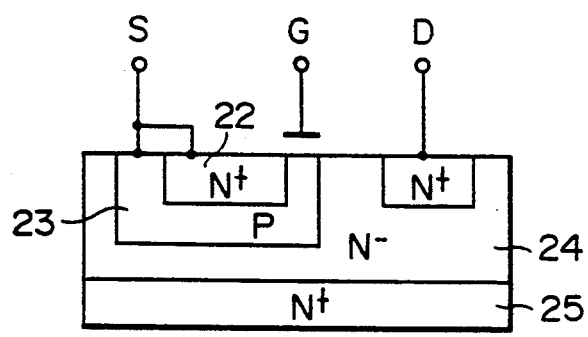
FIG. 6 is a cross sectional view sowing conventional lateral type power MOS transistor.

The chip structure of the power MOS transistor is largely classified into a vertical structure as shown in FIGS. 7 to 9, FIGS. 4 and 5 and a lateral structure as shown in FIG. 6. Particularly, since the point, in which the transistors are formed on one chip, has large technical merits in a case of the lateral structure, the lateral structure will be explained in more detail.

Figure 11:
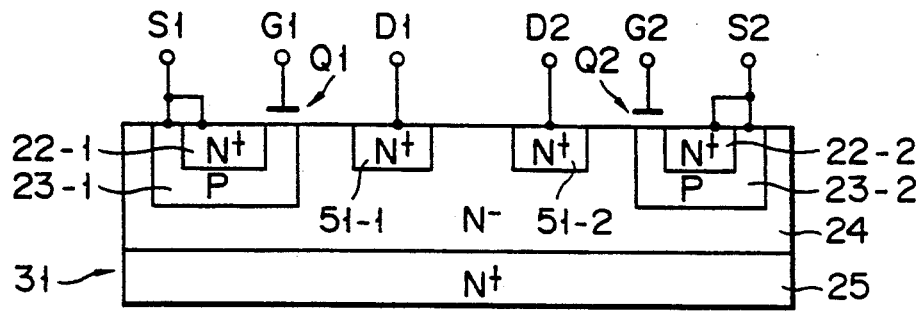
FIGS. 11 and 12 are cross sectional views showing the transistor of FIG. 10.
Figure 12:
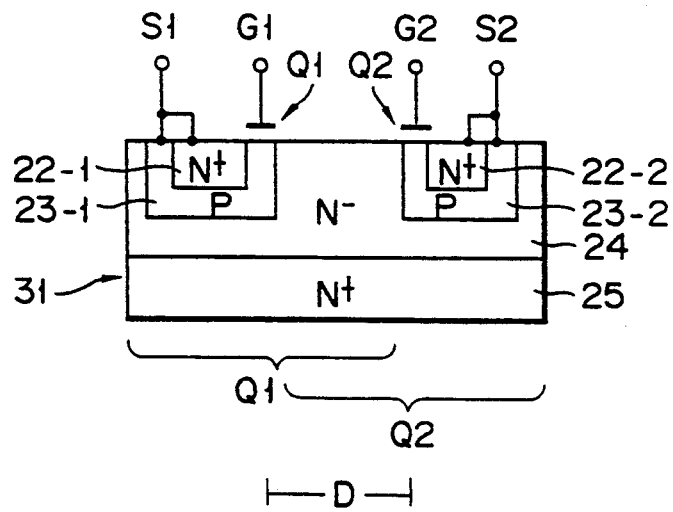

FIG. 11 is a view showing the case wherein two power MOS transistor elements having a lateral structure of FIG. 6 are formed on one chip as having N+ layers 51-1 and 51-2 for taking up drains D1 and D2 serving as a common drain section. Moreover, as shown in FIG. 12, the drain region is used in common with intention of using the portion between sources S1 and S2 as a switch. Then, N+ layers 51-1 and 51-2 is omitted, thereby the entire device can be further miniaturized. For example, if the positive potential is applied to the source S1 and the negative potential is applied to the source S2 and an off operation is performed, almost all the potential between the sources S1 and S2 is shared by the breakdown voltage (reverse bias) between the drain and source of the transistor Q2. This breakdown voltage shares a common drain region D of the transistors Q1 and Q2 shown in FIG. 12. On the other hand, if the negative potential is applied to the source S1 and the positive potential is applied to the source S2, the potential between the sources S1 and S2 is shared by the breakdown voltage (reverse bias) between the drain and source of the transistor Q1. This breakdown voltage also shares the common drain region D of the transistors Q1 and Q2. By the formation of one chip in the common drain D, the size of the chip can be largely reduced. Also, an on-resistance between the sources S1 and S2 can be largely reduced. In other words, the distance between the gates G1 and G2 of the transistors Q1 and Q2 can be expected to be made half, thereby making it possible to make the inner on-resistance approximately half.

As mentioned above, the highly functioned chip is used, and combined with the photoelectric transfer element such as a photo cell, thereby a solid state relay can be simply formed as shown in FIG. 7.

The above highly functioned chip can bring about the following points:

(1) By use of the common drain, the formation of one chip can be obtained instead of two chips;

(2) By the above point (1), the area of the chip can be reduced and the capacity can be made large in the same area; and (3) The reduction of the on-resistance between the sources S1 and S2 can be realized.

Figure 13:
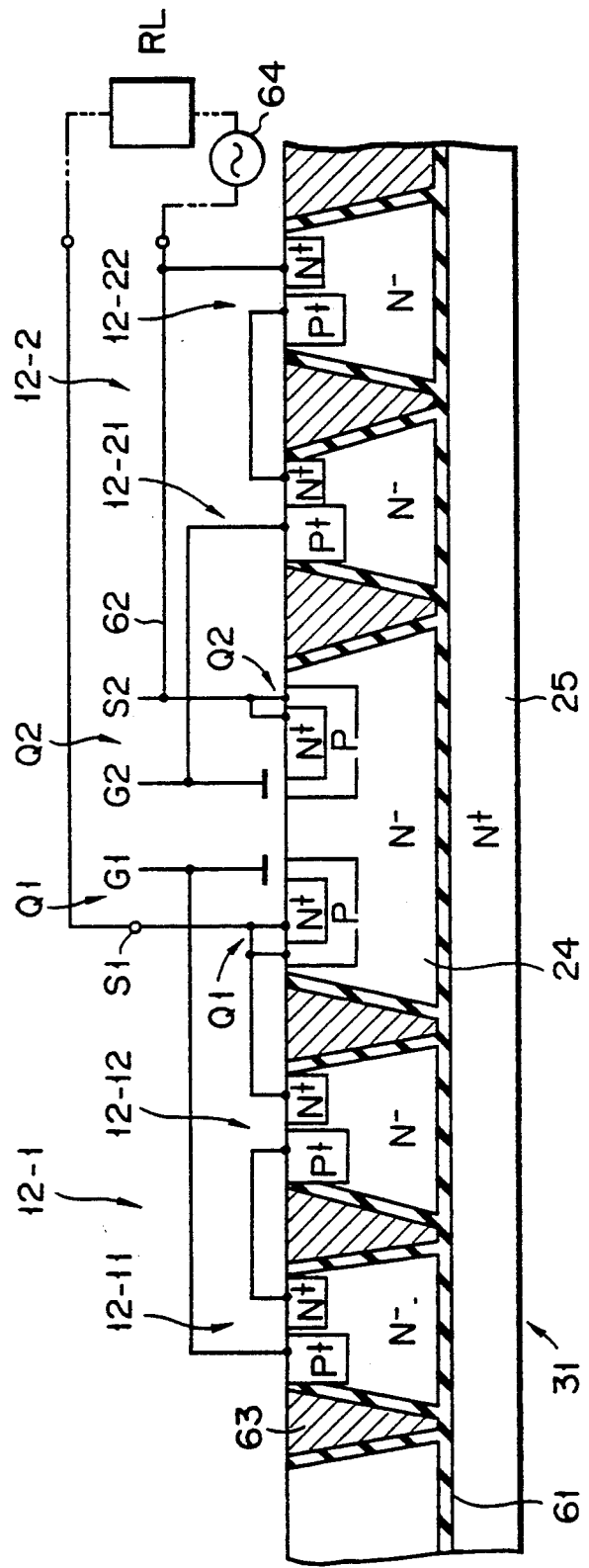
FIG. 13 is a cross sectional view showing further different embodiment of the present invention.

FIG. 13 is an example showing a case wherein a separating method using dielectric 61 (for example, $SiO_2$) is employed to improve integration. More specifically, it is aimed to obtain the formation of one chip of the transistors Q1 and Q2 and the photoelectric transfer elements 12-1 and 12-2. In this case, regarding the photoelectric transfer element 12-1, photoelectric transfer elements 12-11 and 12-12 are connected in series, thereby obtaining photoelectric transfer voltages. Also, regarding the photoelectric transfer 12-2, photoelectric transfer elements 12-21 and 12-22 are connected in series, thereby obtaining photoelectric transfer voltages. A wire 62, which is formed on the chip 31, is, for example, aluminum. Reference 63 is, for example, Si. In the wiring other than the chip, a power source 64 and a load RL are formed, thereby forming a circuit.

As mentioned above, the present invention provides a semiconductor device wherein the formation of one chip can be obtained by use of a common drain of a power MOS transistor, the area of the chip can be reduced, the reduction of an on-resistance can be realized, thereby the assembly of the device can be simplified, reliance can be improved, and the cost of an applied device can be reduced.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
   first and second power MOS transistors of the same channel type formed on the same semiconductor chip with a common drain; and
   means for supplying a control signal to the gate of each of said transistors, wherein said supplying means has first means for generating a first signal other than an electrical signal and second means, arranged to be electrically separated from said first means, for converting said first signal into the control signal and supplying the control signal to the gate of each of said first and second power MOS transistors, and sources of said first and second power MOS transistors are selectively connected to each other through said first and second power MOS transistors.

2. The semiconductor device according to claim 1, wherein said first means comprises a photoelectric transfer element and said second means comprises a light emitting element, and said control signal is obtained by said photoelectric transfer element photoelectrically transferring light from said light-emitting element.

3. The semiconductor device according to claim 1, wherein said control signal is obtained through a transformer.

4. The semiconductor device according to claim 1, wherein both said first and second power MOS transistors form a single switch element.

5. The semiconductor device according to claim 2, wherein said photoelectric transfer element is integrated in said chip together with said power MOS transistors.

6. The semiconductor device according to claim 1, wherein in a semiconductor layer in which the source and drain of each of said first and second power MOS transistors are formed, a region having the same conductivity type as said semiconductor layer and higher concentration than said semiconductor layer is directly formed between said first and second power MOS transistors, and extension of a depletion layer between said first and second power MOS transistors is suppressed by said region having higher concentration.

7. The semiconductor device according to claim 2 or 5, wherein a plurality of single photoelectric transfer elements is formed in series.

* * * * *